(12) United States Patent
Pfeuffer et al.

(10) Patent No.: US 11,121,124 B2
(45) Date of Patent: Sep. 14, 2021

(54) DISPLAY DEVICE WITH A PLURALITY OF SEPARATELY OPERABLE PIXELS FORMED IN A GRID

(71) Applicant: OSRAM Opto Semiconductors GmbH, Regensburg (DE)

(72) Inventors: Alexander F. Pfeuffer, Regensburg (DE); Dominik Scholz, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 64 days.

(21) Appl. No.: 16/347,168

(22) PCT Filed: Nov. 23, 2017

(86) PCT No.: PCT/EP2017/080183
§ 371 (c)(1),
(2) Date: May 2, 2019

(87) PCT Pub. No.: WO2018/099794
PCT Pub. Date: Jun. 7, 2018

(65) Prior Publication Data
US 2020/0058629 A1 Feb. 20, 2020

(30) Foreign Application Priority Data

Nov. 29, 2016 (DE) .......................... 102016123013.8

(51) Int. Cl.
*H01L 25/16* (2006.01)
*H01L 27/12* (2006.01)
(Continued)

(52) U.S. Cl.
CPC ........ *H01L 25/167* (2013.01); *H01L 27/1274* (2013.01); *H01L 33/06* (2013.01);
(Continued)

(58) Field of Classification Search
CPC ... H01L 25/167; H01L 27/1274; H01L 33/06; H01L 33/382; H01L 33/42; H01L 33/60
See application file for complete search history.

(56) References Cited

U.S. PATENT DOCUMENTS 8,716,724 B2 * 5/2014 von Malm .............. H01L 33/62
257/88
9,899,418 B2   2/2018 Pfeuffer et al.
(Continued)

FOREIGN PATENT DOCUMENTS

| DE | 102012112302 A1 | 6/2014 |
| WO | 2014090605 A1 | 6/2014 |
| WO | 2016192939 A1 | 12/2016 |

*Primary Examiner* — Peter Bradford
(74) *Attorney, Agent, or Firm* — Slater Matsil, LLP

(57) ABSTRACT

A display device is disclosed. In an embodiment a display device having a plurality of pixels separately operable from each other includes a semiconductor layer sequence including a first semiconductor layer, an active layer and a second semiconductor layer, a first contact structure contacting the first semiconductor layer and a second contact structure contacting the second semiconductor layer and at least one separating region extending through the first contact structure, the first semiconductor layer and the active layer into the second semiconductor layer, wherein the semiconductor layer sequence and the first contact structure have at least one first recess laterally adjacent with respect to a respective pixel, the first recess extending through the first contact structure, the first semiconductor layer and the active layer into the second semiconductor layer, and wherein the second contact structure includes second contacts extending through the at least one first recess.

19 Claims, 8 Drawing Sheets

(51) Int. Cl.
*H01L 33/06* (2010.01)
*H01L 33/38* (2010.01)
*H01L 33/42* (2010.01)
*H01L 33/60* (2010.01)

(52) U.S. Cl.
CPC ............ *H01L 33/382* (2013.01); *H01L 33/42* (2013.01); *H01L 33/60* (2013.01)

(56) References Cited

U.S. PATENT DOCUMENTS

| | | | |
|---|---|---|---|
| 2010/0038655 A1* | 2/2010 | Chen | H01L 33/32 257/88 |
| 2010/0148072 A1* | 6/2010 | Furst | H01L 27/307 250/361 R |
| 2011/0156064 A1* | 6/2011 | Seo | H01L 25/0753 257/88 |
| 2014/0014894 A1 | 1/2014 | Mohammed et al. | |
| 2014/0239327 A1 | 8/2014 | Konsek et al. | |
| 2015/0014716 A1* | 1/2015 | von Malm | H01L 27/15 257/89 |
| 2015/0362165 A1 | 12/2015 | Chu et al. | |
| 2018/0166499 A1 | 6/2018 | Pfeuffer et al. | |
| 2018/0175262 A1* | 6/2018 | Jansen | H01L 33/54 |

* cited by examiner

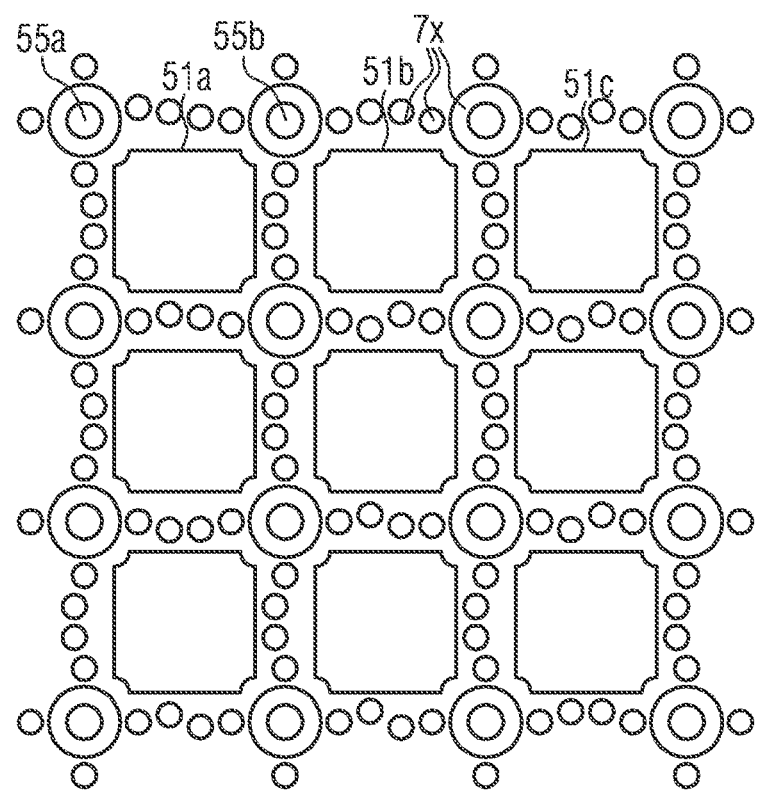

DISPLAY DEVICE WITH A PLURALITY OF SEPARATELY OPERABLE PIXELS FORMED IN A GRID

This patent application is a national phase filing under section 371 of PCT/EP2017/080183, filed Nov. 23, 2017, which claims the priority of German patent application 102016123013.8, filed Nov. 29, 2016, each of which is incorporated herein by reference in its entirety.

TECHNICAL FIELD

A display device is specified.

BACKGROUND

Patent application PCT/EP2016/060554 describes a display device. The disclosure content of patent application PCT/EP2016/060554 is hereby expressly incorporated by reference.

SUMMARY OF THE INVENTION

Embodiments provide a particularly reliable and efficient operation of the display device. Further embodiments provide a display device having improved optical and electrical properties.

In various embodiments a display device is specified. In particular, the display device comprises a plurality of separately operable pixels comprising a semiconductor layer sequence for generating electromagnetic radiation. The semiconductor layer sequence, for example, comprises a first semiconductor layer, an active layer and a second semiconductor layer. The display device may, for example, be a light-emitting diode, in particular a thin-film light-emitting diode, which is free of a growth substrate for the semiconductor layer sequence. The display device can be used as an imaging component of a display device. The display device may also be a light source used in general lighting or in a headlamp such as a motor vehicle headlamp.

The display device extends in a vertical direction between a first main plane and a second main plane, the vertical direction being transverse or perpendicular to the first and/or second main plane. The main planes may, for example, be the main extension planes on the top surface and the bottom surface of the display device. The display device is extended in a lateral direction, i.e., at least partially parallel to the main planes, and has a thickness in the vertical direction that is small compared to a maximum extension of the display device in a lateral direction.

For example, the semiconductor layer sequence, especially the active layer, contains a III-V compound semiconductor material. III-V compound semiconductor materials are particularly suitable for radiation generation in the ultraviolet ($Al_x In_y Ga_{1-x-y} N$), visible ($Al_x In_y Ga_{1-x-y} N$, especially for blue to green radiation, or $Al_x In_y Ga_{1-x-y} P$, especially for yellow to red radiation) and infrared ($Al_x In_y Ga_{1-x-y} As$) spectral ranges. Here, the following applies in each case: $0 \leq x \leq 1$, $0 \leq y \leq 1$ and $x+y \leq 1$, in particular with $x \neq 1$, $y \neq 1$, $x \neq 0$ and/or $y \neq 0$. III-V compound semiconductor materials, in particular from the material systems mentioned, can still achieve high internal quantum efficiencies in radiation generation.

The active layer is arranged between the first semiconductor layer and the second semiconductor layer. The first semiconductor layer and the second semiconductor layer are expediently of different conductivity types. In particular, the first semiconductor layer may be a p-doped semiconductor layer and the second semiconductor layer an n-doped semiconductor layer. The active layer, the first semiconductor layer and the second semiconductor layer are perpendicular to a stacking direction of the semiconductor layer sequence and/or parallel to the main extension plane, in particular within the manufacturing tolerance.

In the manufacture of the display device, the pixels preferably arise from a common semiconductor layer sequence. The semiconductor layers assigned to a respective pixel, i.e., a lateral region of the semiconductor layer sequence which forms the pixel, can be identical with respect to their material composition and their layer thicknesses to semiconductor layers which are assigned to a further pixel of the display device, apart from production-related fluctuations.

For example, the display device has a carrier. For example, the carrier may have a plurality of switches each assigned to a respective pixel to control the at least one pixel. Alternatively, it is possible for the carrier to have vias for contacting the pixels. This means that the carrier may also be designed without a switch for another application, but may have a plurality of insulated vias through the carrier that can be used for rear rewiring and contacting.

For example, the carrier can mechanically stabilize the semiconductor layer sequence.

The first main plane is located, for example, on the side of the semiconductor layer sequence facing away from the carrier. Accordingly, the second main plane is exemplarily located on the side of the carrier facing away from the semi-conductor layer sequence. The semiconductor layer sequence runs parallel to a main extension plane of the carrier, especially within the manufacturing tolerance.

In at least one embodiment, the display device comprises a first contact structure for contacting the first semiconductor layer. The display device further comprises a second contact structure for contacting the second semiconductor layer.

The first contact structure, for example, is arranged between the semiconductor layer sequence and the carrier. In particular, the first contact structure is electro-conductively connected to the first semiconductor layer. By means of the first contact structure, the first semiconductor layer can be electrically contacted from the second main plane.

For example, the first contact structure consists of a metallic layer or a metallic stack of layers. The first contact structure preferably has an optical mirror effect. For example, the first contact structure consists of a material such as Al, Ag, Au, or Rh, or comprises such a material. In particular, a layer thickness of the first contact structure is between 50 nm and 500 nm.

In addition or alternatively, a transparent conductive oxide (TCO) layer is inserted between the semiconductor layer sequence and the metallic layer or layer stack. As an example, this consists of a material such as ITO, SnO, ZnO, or comprises such a material. In particular, a layer thickness of such a layer is smaller than 100 nm.

In addition, a dielectric or a dielectric layer stack can be arranged between the transparent conductive oxide layer and the metallic layer or layer stack. For example, this consists of $SiO_2$ or comprises $SiO_2$. In particular, the dielectric or dielectric layer stack has a layer thickness between 100 nm and 1000 nm. For example, the dielectric or the dielectric layer stack may have recesses, especially isolated ones. This provides an electrically conductive connection between the transparent conductive oxide layer and the metallic layer or layer stack.

The second contact structure, for example, is also arranged between the carrier and the semiconductor layer sequence. In particular, the second contact structure is electro-conductively connected to the second semiconductor layer. By means of the second contact structure, the second semiconductor layer can be electrically contacted from the second main plane.

For example, the first contact structure and/or the second contact structure or at least a partial layer thereof is reflective, in particular with respect to the radiation generated during operation of the display device.

In at least one embodiment, the first contact structure has first contacts that can be operated separately from each other. The first contacts each extend laterally along the first semiconductor layer without interruption. With their contours, the first contacts each limit one pixel laterally.

In this context, the first contacts can, for example, each be assigned a switch to control at least one pixel. In particular, the first contacts are electrically connected to the respective switch. The first contacts electrically contact the first semiconductor layer separately from each other. In a top view of the display device in the vertical direction, the lateral contour of one of the first contacts limits one pixel each. In other words, a lateral extension of a pixel is formed by a lateral extension of a respective first contact. In particular, the first contacts are each assigned to a pixel for controlling the pixel; in particular they are assigned unambiguously.

In at least one embodiment, the semiconductor layer sequence and the first contact structure have at least one recess laterally adjacent with respect to a respective pixel. The at least one recess extends through the first contact structure, the first semiconductor layer and the active layer into the second semiconductor layer.

In particular, the at least one recess extends transversely or perpendicularly from the second main plane to the first main plane. The at least one recess interrupts the first contact structure in particular. For example, by means of the at least one recess, first contacts following each other laterally are electrically separated from each other. The at least one recess extends in the lateral direction in particular in an area of optical separation between the individual pixels in a plan view of the display device. Optical separation is, in particular, a lateral separation of the individual pixels which, for example, can be perceived directly by a viewer in a plan view of the display device and/or can be measured by suitable magnification and/or can be perceived at least indirectly, for example, in the form of an increased impression of sharpness by the viewer in a plan view.

In at least one embodiment, the second contact structure has second contacts. The second contacts extend from a side of the semiconductor layer sequence facing the first contact structure through the at least one recess.

The second contacts each contact the second semiconductor layer electrically. In particular, the second contacts can be electrically connected to each other in the form of a common electrode of the display device.

The second contacts are in particular electrically isolated from the first semiconductor layer. In this context, the display device may have a separating structure which electrically separates the second contacts from the first contacts and/or the first semiconductor layer. For example, the separating structure limits the at least one recess laterally for this purpose. For example, the second contacts completely fill the at least one recess, which is laterally limited by the separating structure. Alternatively, the second contacts cover the separating structure and the second semiconductor layer at one end face of the at least one recess, i.e., in particular they do not completely fill the respective recess.

A contacting of the second semiconductor layer by means of the second contacts extends in particular in the area of the optical separation between the individual pixels in plan view of the display device. The optical separation between the pixels can thus be combined in particular with the contacting of the second semiconductor layer. For example, the separating structure in this context may be reflective, especially with respect to the radiation generated during operation of the display device. The separating structure, for example, consists of a partially or completely transparent dielectric, for example, silicon oxide and/or silicon nitride and/or aluminum oxide. For example, depending on the angle, a reflection can take place directly at the dielectric in the form of total reflection, or at the metal layer of the second contact structure behind it with respect to a beam path of the radiation generated during operation. The second contact structure can be formed as a layer stack and contains a highly reflective material such as silver. As the actual contact material advantageously a transparent conductive oxide can be used, e.g., ZnO, ITO.

According to at least one embodiment of the display device, the display device comprises at least one separating region extending through the first contact structure, the first semiconductor layer and the active layer into the second semiconductor layer. The separating region can include, for example, an opening or a recess. The opening or recess of the separating region may, for example, be produced using at least one etching process. The at least one separating region can have the form of a trench, a pyramid, a cone, a truncated pyramid, a truncated cone, a cylinder or other, also irregular forms. These structures are designed as inverted structures, for example, as recesses in the semiconductor layer sequence.

According to at least one embodiment of the display device, the at least one separating region is arranged between two laterally adjacent pixels. This means, for example, that the separating region is arranged in the area of the optical separation between laterally adjacent pixels. In particular, it is possible that at least one separating region is arranged between each pair of laterally adjacent pixels. It is also possible for each pixel to be surrounded by separating regions that frame the pixel. Here, it is possible that the separating regions surround the pixel without interruption, or that spaces are provided between individual separating regions, so that material of the semiconductor layer sequence is arranged between the separating regions.

According to at least one embodiment of the display device, the at least one separating region is configured for reducing optical and/or electrical crosstalk between the laterally adjacent pixels. This means that the separating region contributes to a reduction of the optical and/or electrical crosstalk between adjacent pixels. In particular, the optical and/or electrical separation between the pixels is not complete, but the pixels remain connected to each other via an area of the second semiconductor layer which has a reduced thickness.

The reduction of optical and/or electrical crosstalk between adjacent pixels can be achieved, for example, by offering coupling-out structures through the separating region which reduce optical crosstalk from one pixel to the adjacent pixel. In addition, the thickness of the semiconductor layer sequence is reduced in the region of the at least one separating region, whereby the electrical connection between adjacent pixels is deteriorated and the coupling-out of electromagnetic radiation is improved.

The at least one separating region does not extend completely through the semiconductor layer sequence, but only into the second semiconductor layer. This means that the semiconductor layer sequence is uninterrupted on its top side facing away from the first contact structure and/or the carrier and is not interrupted either by the at least one separating region or by the recess through which the second contacts extend. In this way, the semiconductor layer sequence in the display device is uninterrupted on its top side facing away from the carrier.

The first semiconductor layer, for example, has a maximum thickness of 200-300 nm. The active layer has a maximum thickness of 100 nm. The second semiconductor layer has a thickness between 3 and 6 µm. Within the second semiconductor layer there are highly doped areas which are helpful for current expansion and for the formation of the second contacts. At the beginning of the epitaxial deposition of the semiconductor layer sequence, for example, a slightly doped matching layer (buffer) is grown to reduce defects.

The separating regions are then etched as deeply as possible into the semiconductor stack, wherein a closed second semiconductor layer remains after the separation of the growth substrate and the roughening of the top side of the second semiconductor layer originally facing the growth substrate. Suitable depths are, when there is only one etching depth for second contact areas and separation trenches within the highly doped layer for the second contact areas, e.g., at 500-1000 µm.

In particular, the depth of the separating regions is at least one tenth to one fifth of the thickness of the entire semiconductor layer stack if the same recess is used for the separating regions and the second contacts.

If different etching depths are provided for the second contacts and the separation trenches, then the depth of the separating regions is, for example, between a quarter and a half of the thickness of the semiconductor layer stack.

According to at least one embodiment of the display device, the separating region comprises a recess which is at least partially filled with an electrically insulating material. For example, the electrically insulating material may be the same material as that forming the separating structure, which electrically separates the first contacts from the second contacts. For example, the electrically insulating material may be a partially or fully transparent dielectric, such as silicon oxide and/or silicon nitride and/or aluminum oxide.

In particular, it is possible that the recess of the separating region and the recess through which the second contacts extend are interconnected, the electrically insulating material then being disrupted only in the region of the second contacts, so that the second contacts can be in direct contact with the second semiconductor layer.

According to at least one embodiment, the recess is filled in places with a light-absorbing material. The light absorbing material can, for example, be formed with a silicon nitride or an undoped amorphous silicon. Such materials absorb electromagnetic radiation especially in the spectral range of blue light. It is also possible for the recess to be filled with a combination of transparent and light-absorbing materials. For example, the recess can then be filled with a layer sequence of crystalline or polycrystalline silicon dioxide and amorphous silicon. Furthermore, metallic materials such as titanium or chrome can be used as light-absorbing materials. It has been found that the use of light-absorbing materials can improve the contrast between the pixels. Due to the reduced thickness of the second semiconductor layer in the region of the separating region, the coupling-out structures on the top side of the semiconductor layer sequence can lead to increased brightness, so that the top side of the semiconductor layer sequence appears brighter than the pixels in the region of the separating regions during operation. With a light-absorbing material in the separating regions, the brightness in the separating regions can be adjusted to the brightness of the pixels, so that both areas appear essentially equally bright.

According to at least one embodiment, a light-absorbing material is arranged between the at least one separating region and a carrier for the semiconductor layer sequence. For example, the light-absorbing material may be one of the materials described above. The light-absorbing material can in particular border directly on an electrically insulating, transparent material of the separating region. The light-absorbing material can also contribute to reducing the brightness in the separating regions.

According to at least one embodiment of the display device, the at least one separating region is arranged between two second contacts. This means that the at least one separating region is arranged between two adjacent pixels and between two second contacts. For example, it is possible for the separating region to be arranged without interruption between the two second contacts. In this case, the separating region, for example, in the form of a separation trench, extends along one side of a pixel between two second contacts assigned to the pixel. With such a separating region, a particularly good electrical separation between two adjacent pixels is possible.

According to at least one embodiment of the display device, two or more of the separating regions are arranged between the two second contacts, the separating regions being spaced apart from each other. It is possible that the separating regions are designed as parallel separation trenches which can connect the two second contacts without interruption. Furthermore, it is possible that several individual separating regions, which are spaced from each other, are arranged along an imaginary line or an imaginary straight line between the two second contacts, for example. In this case several separating regions, which are designed as pyramid-shaped or cone-shaped or truncated-cone-shaped or truncated-pyramid-shaped recesses filled with electrically insulating material, for example, are arranged between the two second contacts.

Separating regions formed in this way can be distinguished by the fact that, with good optical and electrical separation between adjacent pixels, as little material as possible of the semiconductor layer sequence is removed to form the separating regions, so that the pixels can have a particularly large area. In addition, such recesses have a reduced volume which is filled with a dielectric or metal (e.g., solder material), for example. In this way, the separating regions can be filled with the solder material with particularly few voids or defects (so-called blowholes).

According to at least one embodiment of the display device, the at least one separating region extends further into the second semiconductor layer than the recess through which the second contacts extend. In other words, the separating region is deeper than the recess through which the second contacts are guided. This is advantageous if the preferred etching depth for the second contacts is significantly smaller than the total thickness of the first and second semiconductor layers due to electrical boundary conditions. It is thus possible that the thickness of the second semiconductor layer is particularly strongly reduced in the area of the at least one separating region, whereby a particularly efficient reduction of the optical and/or electrical crosstalk between adjacent pixels occurs.

In at least one embodiment, the display device with a plurality of separately operable pixels comprises a semiconductor layer sequence for generating electromagnetic radiation. The semiconductor layer sequence comprises a first semiconductor layer, an active layer and a second semiconductor layer.

The display device further comprises a first contact structure for contacting the first semiconductor layer and a second contact structure for contacting the second semiconductor layer. The first contact structure has separately operable first contacts which extend laterally along the first semiconductor layer without interruption. The contour of each of the first contacts limits one pixel laterally.

The semiconductor layer sequence and the first contact structure comprise at least one recess laterally adjacent with respect to a respective pixel, said recess extending through the first contact structure, the first semiconductor layer and the active layer into the second semiconductor layer. The second contact structure has second contacts extending through the at least one recess from a side of the semiconductor layer sequence facing the first contact structure.

This enables a particularly advantageous lateral space utilization of the display device, in which a separation trench between the individual pixels of the first contact structure and the first semiconductor layer is used as a via for the second semiconductor layer. A ratio of radiating area of the display device to non-radiating area can thus be kept particularly high so as to contribute to a high efficiency of the display device. Furthermore, by contacting in a lateral edge region with respect to the individual pixels, an uninterrupted luminous image of the respective pixels is made possible. In particular, it is possible to avoid a dark area within a pixel that can be perceived due to the contact. Furthermore, redundant contacting of the pixels is made possible, thus contributing to the reliability of the display device.

In at least one embodiment, the first and second contacts are each in direct contact with the first and second semiconductor layers. The first and second contacts electrically contact the respective semiconductor layers in particular directly. For example, the first contacts and the first semiconductor layer are immediately adjacent to each other laterally. For example, the second contacts extend through a respective recess into the second semiconductor layer.

In at least one embodiment, at least one pixel is assigned a plurality of second contacts which contact the respective pixel redundantly. The several second contacts are in particular laterally adjacent to the at least one pixel. Operation of the at least one pixel is effected by supplying a current to the semiconductor layer sequence via the plurality of second contacts assigned to the pixel and the respective first contact.

By arranging the second contacts in a lateral edge region of the pixels, several redundant second contacts can be assigned to a single pixel. A failure of one of the several second contacts can thus be compensated particularly easily. This contributes to a high yield when manufacturing the display device as well as its high reliability.

In at least one embodiment, at least one of the second contacts is arranged laterally adjacent to a plurality of adjacent pixels and is designed for contacting the plurality of adjacent pixels. In other words, the at least one second contact is assigned in each case to the plurality of adjacent pixels. In an advantageous way, several pixels can thus be operated by means of a single contact. A space requirement for contacting the pixels can thus be kept small so that a high ratio of radiating area of the display device to non-radiating area is contributed to.

In at least one embodiment, the pixels are arranged laterally separated in a grid-like manner. The pixels are arranged, for example, in rows and columns arranged crosswise or perpendicular to the latter, wherein the rows and columns are separated by separating areas. The separating regions of the lateral separation also run, for example, along the rows and columns arranged crosswise or perpendicular to the latter. The lateral separation forms a grid, which encloses grid points or nodes of the grid, for example, at intersections of the separating regions. In other words, the pixels are arranged, with respect to the grid, especially in the spaces of the grid formed by the separating regions. This means that the pixels are arranged optically separated in a top view of the display device. At least one of the second contacts is arranged on a node of the grid.

For example, the pixels can be arranged separately in the manner of a regular polygonal grid. A lateral separation of the pixels does not necessarily have to occur along straight lines. Rather, lateral separation can also result in pixels with at least areas of curved or bent sides. For example, the pixels can be perceived as circular dots. In an advantageous way, a control of grid-like, separately arranged pixels is simplified. The display device can also be used to display shapes, figures or characters precisely and flexibly.

In at least one embodiment, one of the second contacts is arranged on each node of the grid. In an advantageous way, the respective second contact is thus arranged in an optical separating region between the pixels, so that a radiating surface of the display device can be held uninterrupted and with maximum size. In particular, the respective second contact, when arranged corresponding to a node of the grid, can laterally border on several pixels, for example, on four pixels of a regular rectangular grid. This makes it possible to operate a particularly high number of adjacent pixels with only one respective second contact.

In at least one embodiment, a second contact is arranged between two nodes adjacent to each other with respect to a column and/or a row, respectively. Thus the respective second contact, for example, is assigned to two pixels.

In at least one embodiment, one of the second contacts is arranged on each second laterally successive node of the grid. In an advantageous way, the display device can thus be operated without redundant second contacts, so that a particularly high surface utilization of the display device is possible. Deviating from this, it is also conceivable that one of the second contacts is arranged on each $x^{th}$ laterally successive node of the grid, where x can be any natural number. In other words, fractions of the nodes other than 1 and 0.5 can also be occupied by second contacts.

In at least one embodiment, at least one of the second contacts assigned to a pixel adjacent to a lateral edge region of the display device is designed to extend parallel along the edge region. This contributes to a uniform contour of the display device and process reliability in the manufacture of the display device. For example, mechanical weak points of the display device, especially with regard to a separation process, can be avoided. For example, the respective second contact terminates flush with the lateral edge region of the display device in such a way that in a transition region around the respective second contact along an edge of the display device a substantially flat surface is formed in which the structure of the respective second contact does not emerge. Deviating from this, the respective second contact is arranged at least in such a way that at least one edge-free surface is formed in said transition region.

In at least one embodiment, a lateral extension of second contacts assigned to a pixel is dependent in each case on a number of second contacts assigned to the respective pixel. The lateral extension of the second contacts can vary both in shape and size. A second contact assigned to a particular pixel borders laterally on the respective pixel in particular. The respective pixel is operated by a current supply via the second contacts assigned to the pixel as well as the respective first contact.

An adjustment of the lateral extension of the second contacts enables a particularly uniform luminous image of the display device. For example, a brightness of the individual pixels is influenced by a current flow through the assigned first and second contacts. The current flow through the contacts depends in particular on a cross-sectional area of the respective contacts.

As an example, a number of second contacts assigned to a pixel can be reduced in comparison with further pixels of the display device, so that, by simultaneously enlarging the second contacts assigned to the pixel in comparison with the second contacts assigned to the further pixels of the display device, a cumulative current flow for operating the pixels is substantially the same, and a uniform brightness of the pixels is achieved.

In at least one embodiment, at least one of the second contacts assigned to a pixel adjacent to a lateral edge region of the display device has a predetermined distance by which the respective second contact is offset towards a lateral interior of the display device. For example, the respective second contact is arranged laterally offset towards the interior of the display device such that the respective second contact is flush with the edge, or at least lateral protrusion of the respective second contact with respect to the transition region around the respective second contact along the edge of the display device is reduced or avoided. Here, the respective second contact can, for example, be arranged on the grid mentioned above, but can be laterally shifted relative to a node of the grid. In an advantageous way, this contributes to a high level of process reliability in the manufacture of the display device.

In at least one embodiment, a lateral extension of at least one of the second contacts is circular. In an advantageous way, a particularly uniform current supply to the pixels assigned to the at least one circular second contact is thus made possible.

In at least one embodiment, the lateral extension of a respective second contact can vary in a vertical direction. In particular, the respective second contact and/or the respective recess may be conical or cone-shaped. For example, the lateral extension of the respective recess and/or the respective second contact towards the second main plane is increased. A lateral boundary of a pixel assigned to the respective second contact is then, for example, funnel-shaped, so that a particularly advantageous radiation characteristic of radiation generated in the area of the respective pixel is achieved.

In at least one embodiment, at least one of the second contacts encloses a pixel laterally. A particularly uniform current flow to the laterally enclosed pixel is made possible in an advantageous manner. This contributes to an evenly generated radiation in the area of the pixel, especially with regard to a perceptible brightness of the pixel.

In at least one embodiment, the second contact structure is grid-shaped. In an advantageous way, this enables particularly simple, redundant contacting as well as an even current supply to the pixels.

Further characteristics, designs and functionalities can be derived from the following description of the exemplary embodiments in connection with the figures.

According to at least one embodiment, the separating regions only extend in one spatial direction. The separating regions can thus be used, for example, to create a light-dark edge of the radiation of a car headlamp that runs horizontally.

It is also possible that the separating regions are only located between some of the pixels. This allows the high contrast required for a vehicle headlamp to be produced in order to achieve a light-dark edge. This is then generated from a certain area of the pixels.

BRIEF DESCRIPTION OF THE DRAWINGS

In the Figures:

FIGS. 11 to 15 show an eleventh to fifteenth exemplary embodiment of a display device as shown in FIG. 1 in a schematic plan view.

Identical, similar or identically acting elements are provided with the same reference signs in the figures. The figures and the proportions of the elements depicted in the figures are not to be regarded as true to scale. Rather, individual elements and in particular layer thicknesses may be represented exaggeratedly large for better representability and/or better understanding.

DETAILED DESCRIPTION OF ILLUSTRATIVE EMBODIMENTS

Figure 1:
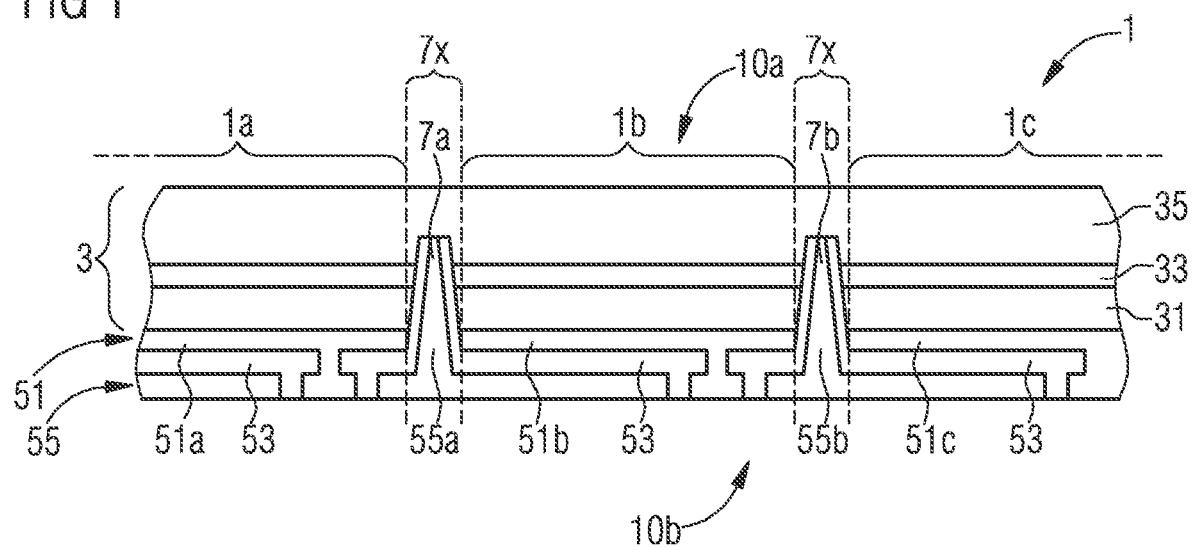
FIG. 1 shows a first exemplary embodiment of a display device with a plurality of separately operable pixels in a schematic lateral sectional view.

A first exemplary embodiment of a display device 1 with a plurality of separately operable pixels 1*a*, 1*b*, 1*c* is shown in FIG. 1. The display device 1 extends in a lateral direction, for example, beyond the displayed section, as indicated by the dotted lines of the pixels 1*a*, 1*c*.

The display device 1 comprises a semiconductor layer sequence 3 comprising a first semiconductor layer 31, an active layer 33 for generating radiation, and a second semiconductor layer 35. The display device 1 extends in a vertical direction between a first main plane 10*a* and a second main plane 10*b*. In particular, the first main plane boa can form a radiation exit surface of the display device 1.

The active layer 33 is arranged between the first semiconductor layer 31 and the second semiconductor layer 35, the two semiconductor layers 31, 35 being of different conductivity types. The first semiconductor layer 31 is particularly p-conducting, and the second semiconductor layer 35 is n-conducting.

Immediately adjacent to the first semiconductor layer 31, a first contact structure 51 extends, enabling electrical contacting of the first semiconductor layer 31. The first contact structure 51 is interrupted by a plurality of recesses 7*a*, 7*b* extending vertically through the display device 1. In particular, the first contact structure 51 is divided into a plurality of first contacts 51*a*, 51*b*, 51*c* which are electrically isolated from each other. A lateral extension of the first contacts 51*a*, 51*b*, 51*c*, sic corresponds to a lateral extension of the pixels 1*a*, 1*b*, 1*c*.

The first contacts 51*a*, 51*b*, 51*c*, sic contact the first semiconductor layer 31 electrically from the second main plane 10b of the display device 1 and enable the pixels 1a, 1b, 1c to be energized separately. In other words, each of the first contacts 51a, 51b, 51c is assigned to one of the pixels 1a, 1b, 1c for operating the respective pixel 1a, 1b, 1c separately.

Between each two adjacent pixels 1a, 1b, is there is arranged at least one separating region 7x which extends through the first contact structure 51, the first semiconductor layer 31 and the active layer 33 into the second semiconductor layer 35. The at least one separating region 7x is designed for optical and/or electrical separation of the adjacent pixels 1a, 1b, 1c. In connection with FIGS. 11 to 15, the possible designs of the separating regions 7x are explained in more detail.

The recesses 7a, 7b are arranged, for example, in an area of a respective separating region 7x between the pixels 1a, 1b, 1c, in particular within the separating regions 7x. The first contacts 51a, 51b, 51c, sic assigned to a respective pixel 1a, 1b, is are thus designed uninterrupted over the entire surface.

The recesses 7a, 7b extend in the vertical direction from the first contact structure 51 further through the first semiconductor layer 31 and the active layer 33. As shown in FIG. 1, the recesses 7a, 7b can also extend into the second semiconductor layer 35. The recesses 7a, 7b are limited by an electrically insulating separating structure 53 lateral to the semiconductor layer sequence 3 and the first contact structure 51. The separating structure 53 also extends laterally on a side facing the second main plane 10b along the first contact structure 51.

A second contact structure 55 also extends in a lateral direction on a side facing the second main plane 10b along the separating structure 53. The second contact structure 55 is electrically separated from the first contact structure 51 by means of the separating structure 53, for example. The second contact structure 55 forms second contacts 55a, 55b, which extend into the recesses 7a, 7b towards the second semiconductor layer 35.

The second contacts 55a, 55b contact the second semiconductor layer 35 electrically from the second main plane 10b of the display device 1 and enable a current supply to the pixels 1a, 1b, 1c. The second contacts 55a, 55b can in particular be electrically connected to each other. For example, the second contact structure 55 then forms a common electrode of the pixels 1a, 1b, 1c of the display device 1.

One of the second contacts 55a, 55b each can be assigned to one of the pixels 1a, 1b, 1c for operating the respective pixel 1a, 1b, 1c. Furthermore, each one of the second contacts 55a, 55b may also be assigned to more than one of the pixels 1a, 1b, 1c for operating the respective pixels 1a, 1b, 1c. In addition, more than one of the second contacts 55a, 55b may in each case be assigned to one of the pixels 1a, 1b, 1c and/or more than one of the pixels 1a, 1b, 1c for operating the respective pixel 1a, 1b, 1c or the respective pixels 1a, 1b, 1c. Deviating from the lateral sectional view shown in FIG. 1, the second contact structure 55 is separated by the separating structure 53 in the paper plane as an example. In further lateral sections of the display device 1 perpendicular to the paper plane, the second contact structure 55 is continuously connected, for example. In other words, the lateral separation of the second contact structure 55 shown in FIG. 1 only exists in one area of the paper plane, for example, but in a plan view this spot is not a separation, but only a local recess which is used for feeding through the respective contact 55a, 55b of the respective pixel 1a, 1b, 1c in the direction of a carrier.

Figure 2:
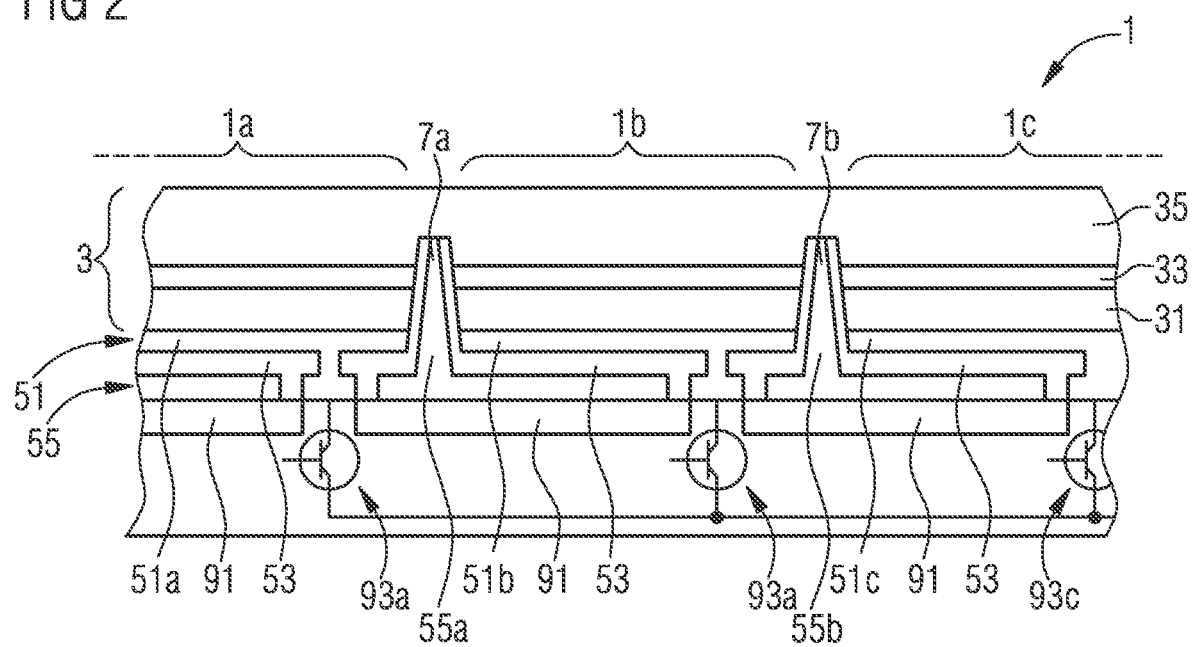
FIG. 2 shows a second exemplary embodiment of the display device as shown in FIG. 1 in a schematic lateral sectional view.
Figure 3:
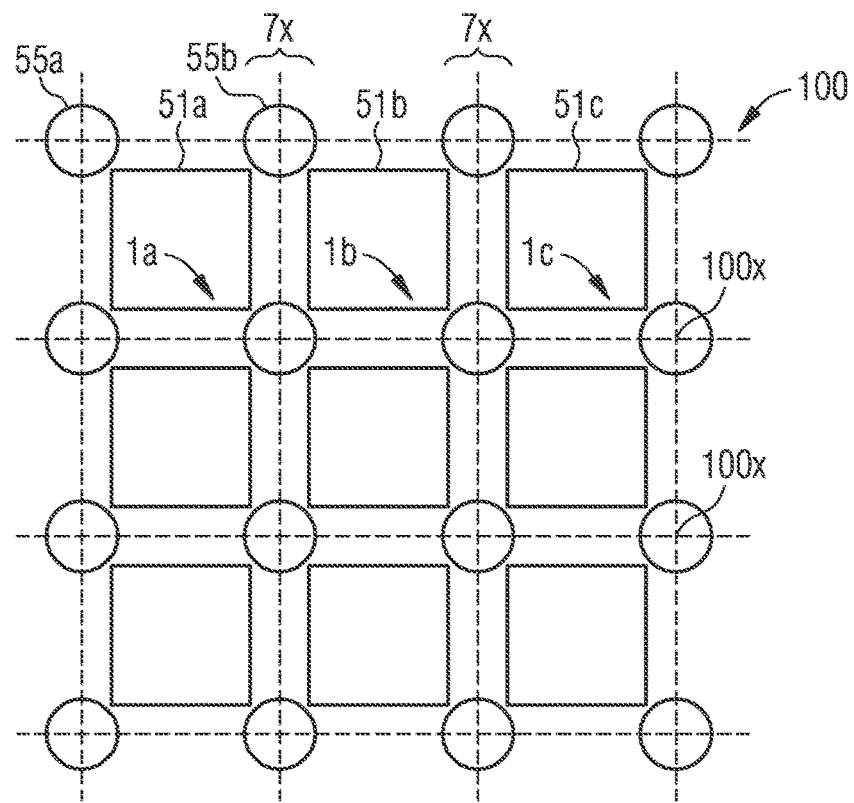
FIGS. 3 to 10 show a third to tenth exemplary embodiment of a display device as shown in FIG. 1 in a schematic plan view.
Figure 4:
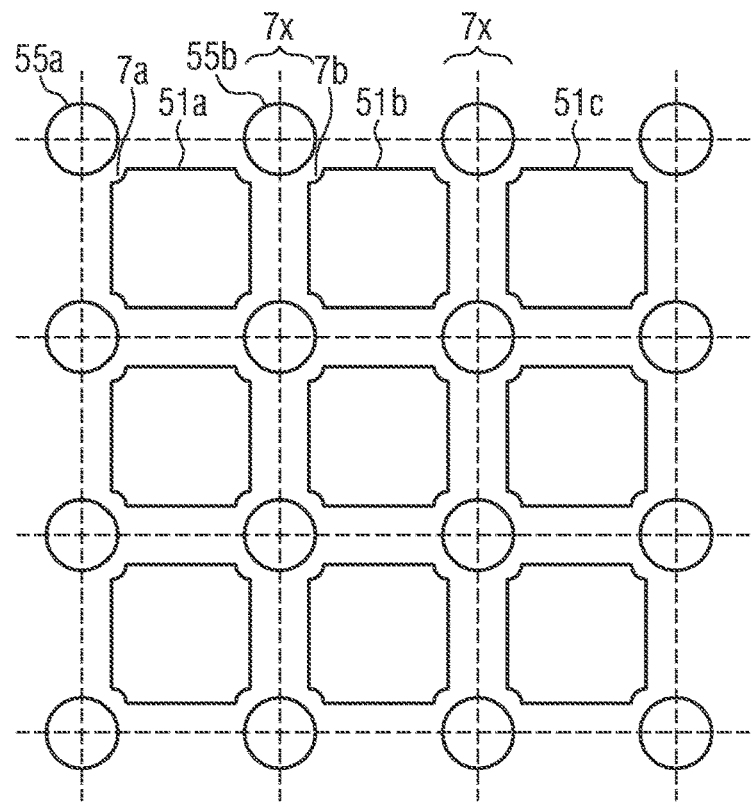
Figure 5:
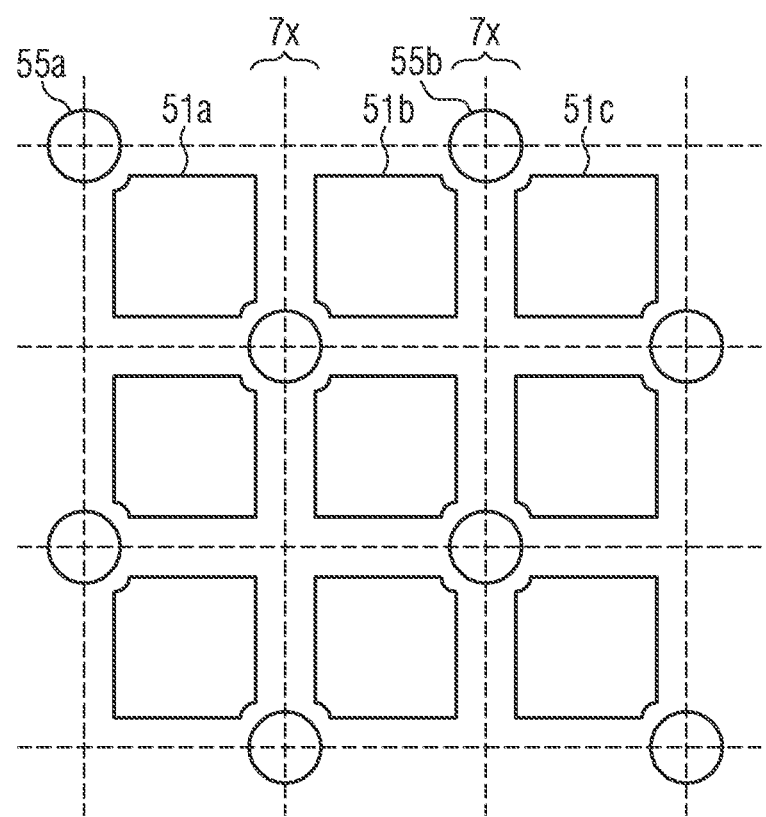
Figure 6:
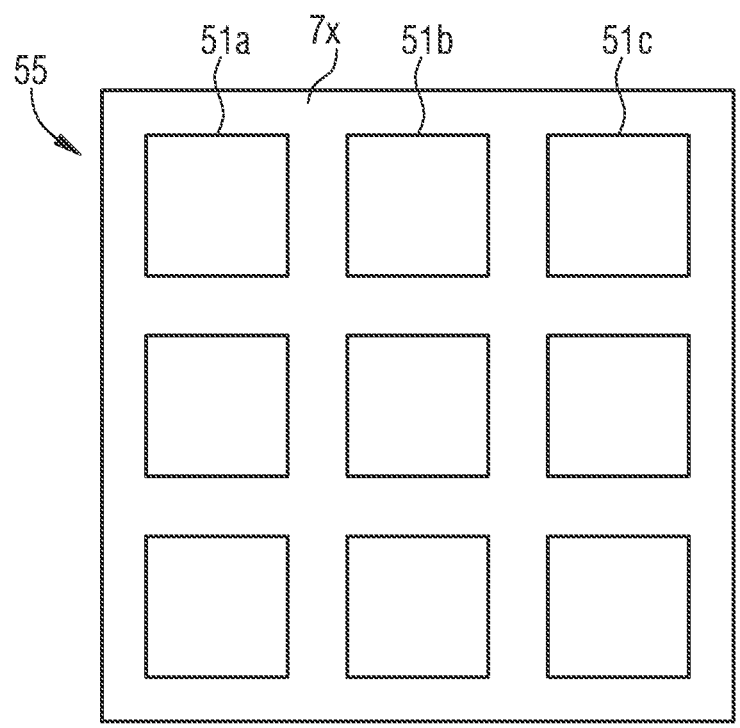
Figure 7:
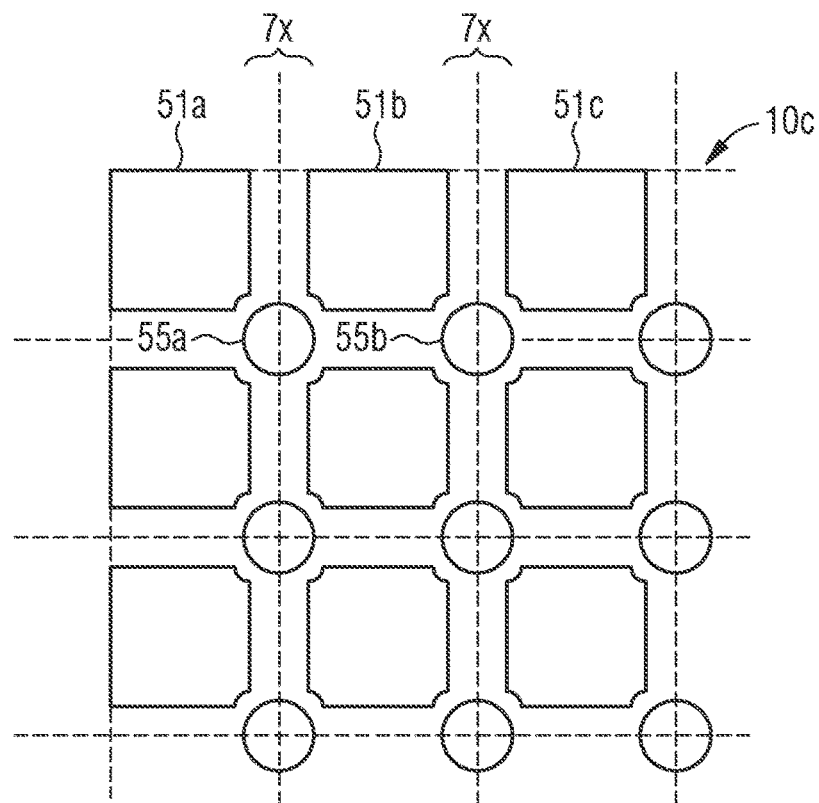
Figure 8:
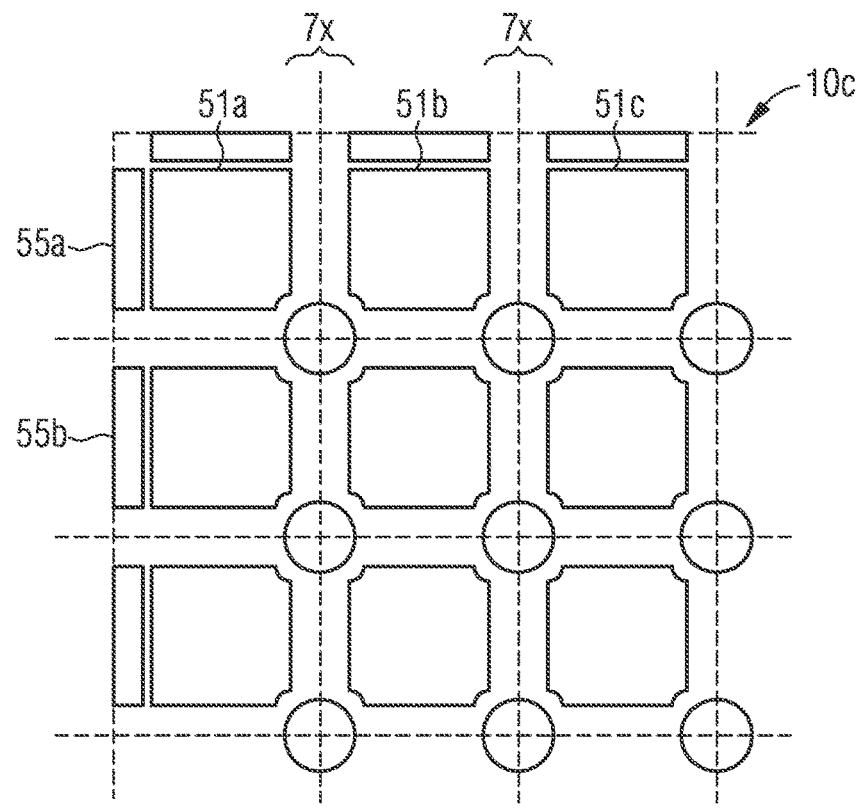
Figure 9:
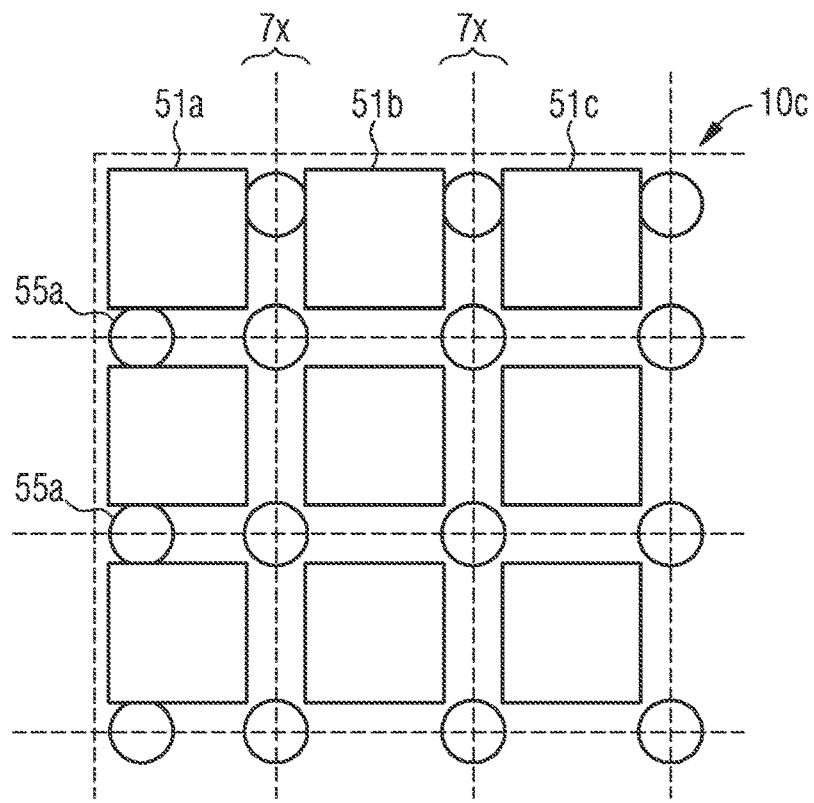
Figure 10:
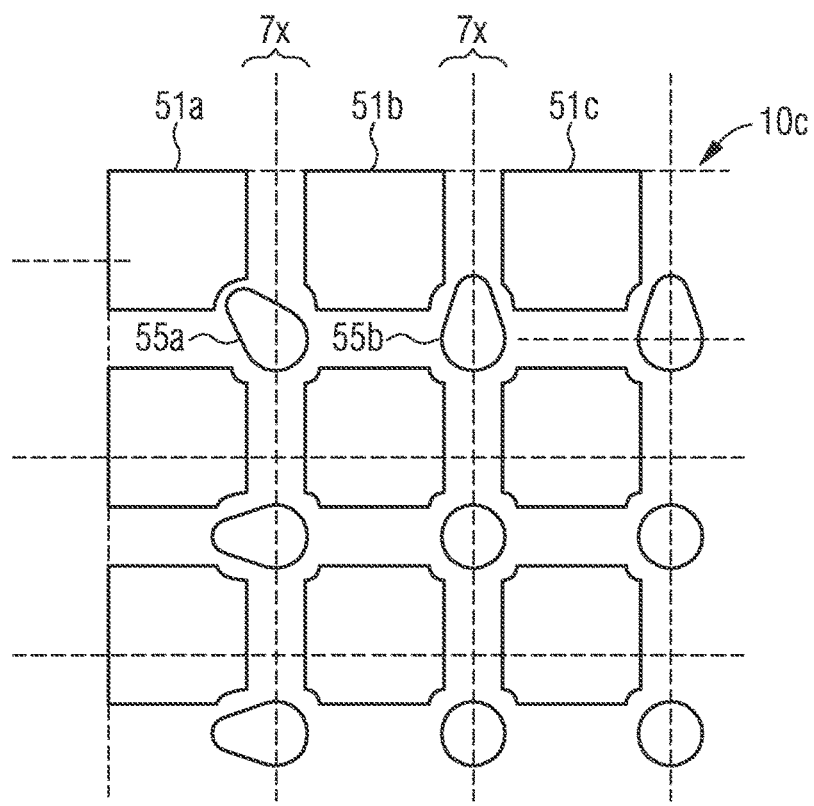

A second exemplary embodiment of the display device 1 according to the first exemplary embodiment is shown in FIG. 2. In contrast to the first exemplary embodiment, the display device 1 additionally has a carrier 9. The carrier 9 can, for example, be used for mechanical stabilization of the display device 1. Alternatively or additionally the carrier 9 can be used for electrical contacting of the display device 1.

For example, the carrier 9 for this purpose comprises a further separating structure 91, which electrically separates the first contact structure 51 and the second contact structure 55 from each other. The carrier further comprises separately operable switches 93a, 93b, 93c, each electrically connected to one of the first contacts 51a, 51b, 51c.

FIGS. 3 to 10 show a third to tenth exemplary embodiment of the display device 1 according to one of the previous examples in a schematic plan view. To simplify the representation, several vertical section planes are shown in the paper plane. In particular, an arrangement of the first contact structure 51 and the second contact structure 55 is shown, wherein a number, shape, size and position of the first contacts 51a, 51b, 51c and the second contacts 55a, 55b may differ in the following exemplary embodiments.

In the third exemplary embodiment (see FIG. 3), the pixels 1a, 1b, 1c are arranged separately in a grid. The lateral extension of the pixels 1a, 1b, 1c essentially corresponds to the first contacts 51a, 51b, 51c. As an example, the grid 100 is a regular grid, in particular a regularly rectangular grid.

The grid comprises nodes 100x, in each of which a column and a row of the grid 100 intersect. The rows and columns of the grid form in particular the separating regions 7x between the individual pixels 1a, 1b, 1c. One of the second contacts 55a, 55b is arranged on each of the nodes 100x. For operating a respective pixel 1a, 1b, 1c, four adjacent second contacts 55a, 55b are assigned to each pixel 1a, 1b, 1c, said second contacts enabling a redundant power supply to the second semiconductor layer 35 (see FIG. 1) in the region of the respective pixel 1a, 1b, 1c. The current is supplied uniformly from all four sides with regard to the respective pixel 1a, 1b, 1c so that a uniform luminance distribution of the pixels 1a, 1b, 1c is possible.

In each case one of the second contacts 55a, 55b is also assigned to four adjacent pixels 1a, 1b, 1c, so that no additional second contacts 55a, 55b are required despite redundant power supply to the second semiconductor layer 35 in the region of the respective pixels 1a, 1b, 1c. A lateral space requirement of the second contacts 55a, 55b is thus kept low in an advantageous way. The arrangement of the second contacts 55a, 55b in the area of the separating regions 7x between the pixels 1a, 1b, 1c further contributes to a particularly high radiating area of the display device 1.

For example, the first contacts 51a, 51b, sic are reflective. The first contacts 51a, 51b, sic can then also be referred to as "contact mirror" or "mirror surface". In this example the first contacts 51a, 51b, 51c are rectangular.

The second contacts 55a, 55b are circular in their lateral extension, for example, so that the second semiconductor layer 35 is uniformly energized in the area of the respective adjacent pixels 1a, 1b, 1c.

In the fourth exemplary embodiment (see FIG. 4), the pixels 1a, 1b, 1c are also arranged separately from each other in the form of a grid. A lateral extension of the recesses 7a, 7b in the region of the first contacts 51a, 51b, 51c is dimensioned so large that a lateral extension of the first contacts 51a, 51b, 51c is reduced in comparison to the third exemplary embodiment. This enables a particularly large lateral extension of the second contacts 55a, 55b, so that a current density can be kept low when the second contacts 55a, 55b are operated. A loss of radiating area due to the reduced lateral extension of the first contacts 55a, 55b is thereby kept low in an advantageous manner in comparison with a contact of the second semiconductor layer 35 arranged centrally with respect to the respective pixels 1a, 1b, 1c. In this connection, the first contacts 51a, 51b, 51c may have recesses at their lateral edge region, in particular circle-segment-shaped recesses.

The fifth exemplary embodiment differs from the previous exemplary embodiments three and four by a number of second contacts 55a, 55b. In this exemplary embodiment, only two second contacts 55a, 55b are assigned to each pixel 1a, 1b, 1c. Deviating from this, a number of second contacts 55a, 55b assigned to each pixel 1a, 1b, 1c may differ further. For example, only one second contact 55a, 55b could be assigned to each pixel 1a, 1b, 1c. Here, for example, a second contact 55a, 55b could be arranged only at a node of every second row and every second column. Advantageously, in the respective first contacts 51a, 51b, 51c, which are assigned to the nodes 100x not occupied by second contacts 55a, 55b, the circle-segment-shaped recesses are omitted (see fourth exemplary embodiment), so that the emission area assigned to a respective pixel 1a, 1b, 1c is maximized.

In the sixth exemplary embodiment (see FIG. 6), the recesses 7a and 7b, for example, form a common recess which extends continuously into the semiconductor layer sequence 3. As an example, this recess is etched into the semiconductor layer sequence 3. The second contacts 55a, 55b, for example, form a continuous second contact structure 55 in this recess, said contact structure laterally enclosing the respective pixels 1a, 1b, 1c.

The seventh exemplary embodiment (see FIG. 7) shows a lateral edge region 10c of the display device 1. In contrast to the previous exemplary embodiments three to six, only two of the second contacts 55a, 55b are assigned to the pixels 1a, 1b, is which adjoin the lateral edge region 10c, or in a lateral corner of the display device is only one of the second contacts 55a, 55b is assigned. Due to a mechanical sensitivity of the second contacts 55a, 55b, this arrangement allows a simplified separation of the display device 1 in the edge region 10c at a reduced failure risk.

In the eighth exemplary embodiment (see FIG. 8), in contrast to the seventh exemplary embodiment, the second contacts 55a, 55b are formed parallel to the lateral edge region 10c in the lateral edge region 10c of the display device 1. For example, the second contacts 55a, 55b can also form a continuous frame of the display device 1. This enables a simplified separation of the display device 1 in the edge region 10c, as well as a uniform current supply and homogeneous brightness also of the pixels 1a, 1b, is in the lateral edge region 10c.

In the ninth exemplary embodiment (see FIG. 9), in contrast to the previous exemplary embodiments seven and eight, the second contacts 55a, 55b are arranged laterally offset in the lateral edge region 10c of the display device 1 towards an interior of the display device 1. This is an advantageous way of increasing reliability during a separation process while keeping a current supply to the respective pixels 1a, 1b, 1c as homogeneous as possible, for example, by removing the second contacts 55a, 55b from the separation edge.

In the tenth exemplary embodiment (see FIG. 10), in contrast to the seventh exemplary embodiment, a shape and size of the lateral extension of the second contacts 55a, 55b, which are assigned to the pixels 1a, 1b, 1c adjacent to the lateral edge region 10c, differ. A lateral extension of the second contacts 55a, 55b in particular towards the edge region 10c is increased compared to the second contacts 55a, 55b in the lateral interior of the display device 1. In an advantageous manner, a current density of the second contacts 55a, 55b and a cumulative current supplied to the second semiconductor layer 35 in a respective region corresponding to a respective pixel 1a, 1b, 1c is thus homogeneous.

In connection with FIGS. 11 to 15 further exemplary embodiments are discussed, in connection with which possible embodiments for the formation of the separating regions 7x are explained in more detail. The different separating regions 7x, as they are explained in connection with the exemplary embodiments of FIGS. 11 to 15, can be used in all the exemplary embodiments of the display device described here.

Figure 11:
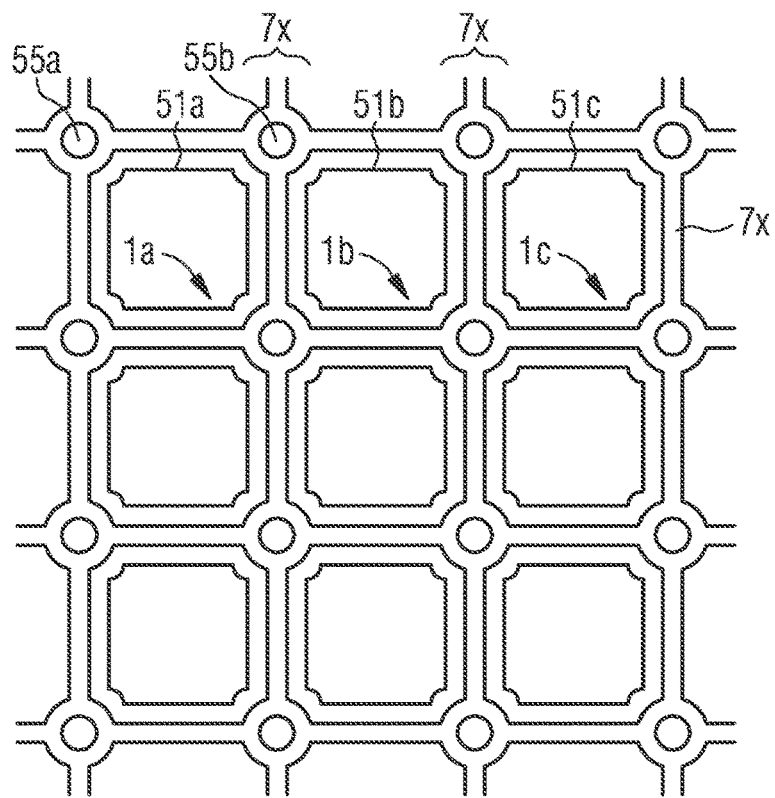

In connection with the eleventh exemplary embodiment of FIG. 11, a display device is described in which the separating regions 7x are formed without interruption between two second contacts 55a and 55b. It is possible that as the separating regions 7x between two second contacts 55a, 55b two or more parallel trenches are formed.

For example, the separating regions 7x include a recess which, together with the recess in which the second contacts are arranged, is created as a trench in the same etching process. However, the second contacts 55a, 55b are still only generated in the corners of the pixels. For example, only there the electrically insulating material is opened, with which the trenches of the separating regions 7x and the recesses of the second contacts 55a, 55b are filled.

Separating regions 7x as are described in connection with FIG. 11 reduce the optical and electrical crosstalk between adjacent pixels 1a, 1b, 1c particularly effectively.

If different contrast requirements exist for the component in different spatial directions, the trench-shaped separating regions can also be executed in only one spatial direction.

Figure 12:
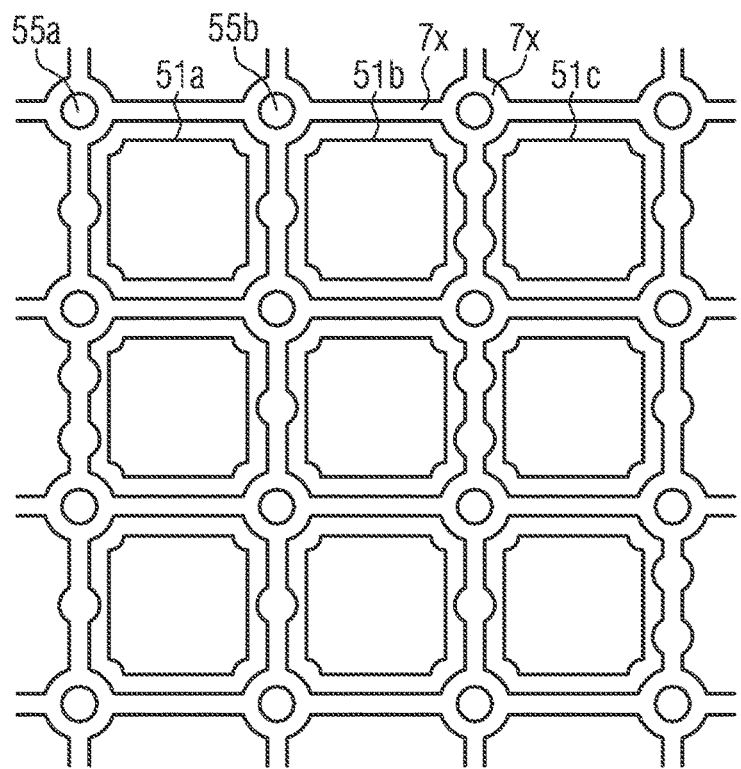

In contrast to FIG. 11, a variant of the separating regions 7x is explained in connection with the twelfth exemplary embodiment of FIG. 12, in which these are not designed as trenches with rectilinear side flanks, but the trenches have a variable width in their course. This variable width can be generated in one or more spatial directions. For example, the trenches may also have a width that varies along the depth of the trenches into the material of the semiconductor layer sequence. In other words, trenches are created whose flanks have a random structure or roughening and can therefore also be described as "frayed" trenches. Such trenches improve the light extraction of the individual pixels and therefore reduce the optical crosstalk to adjacent pixels. The combination of "frayed" and "smooth" trenches can be formed differently in different directions.

Figure 13:
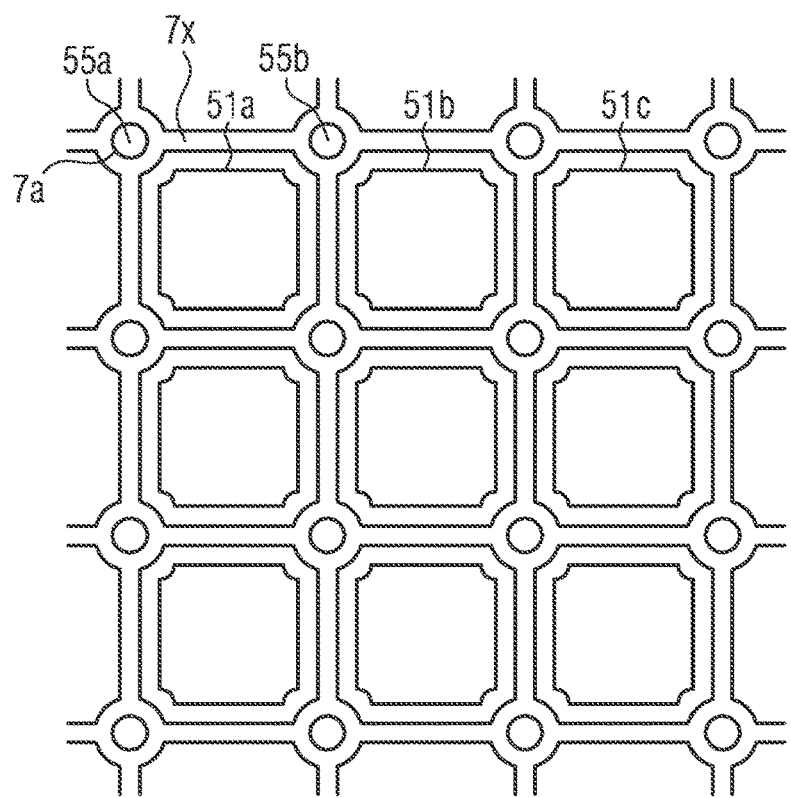

In the thirteenth exemplary embodiment of FIG. 13, the recesses in which the second contacts 55a, 55b run, i.e., recesses 7a, 7b, are produced in a different etching step than the recesses in the separating regions 7x. In this way, it is possible that the different recesses have different etching depths and thus, for example, the separating regions 7x extend further into the semiconductor layer sequence, in particular the second semiconductor layer, than the recesses. Such deepened separating regions 7x increasingly reduce optical crosstalk due to the reduction of semiconductor material and the light extraction at the edge of the separating regions 7x and still allow a good electrical connection in the contact areas 55a, 55b.

Figure 14:
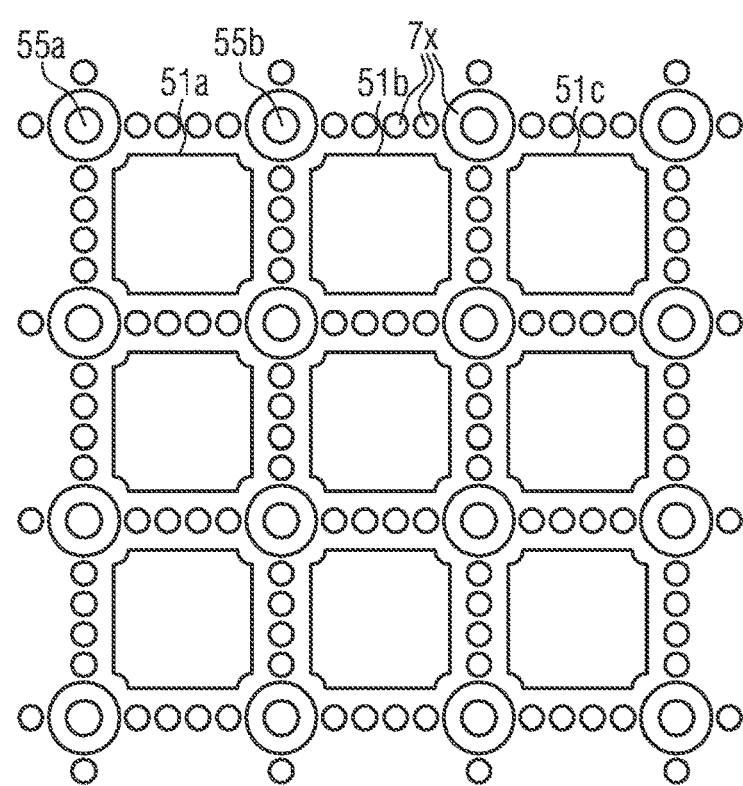

In conjunction with FIG. 14, a fourteenth exemplary embodiment of a display device described here is explained in more detail. In this exemplary embodiment, no continuous recess is produced to form the separating regions 7x between adjacent second contacts 55a, 55b, but the separating regions 7x are produced as a multitude of separating regions between the second contacts by smaller inverted structures, for example, in the form of cylinders, cones, truncated cones, pyramids, truncated pyramids, single-row or multi-row. The number of structures per distance between two adjacent second contacts 55a, 55b can vary. The advantage of this embodiment is, for example, that generally smaller volumes can be etched, which can also be filled more easily with a metallic material such as solder. In different extension directions, different structural densities may be preferred if there are different contrast requirements for different spatial directions.

In contrast to the fourteenth exemplary embodiment, the separating regions 7x in the fifteenth exemplary embodiment of FIG. 15 are not arranged along a straight line, but offset and randomly arranged in one or more rows. This causes the structures between adjacent pixels to become somewhat blurred and softer edges between adjacent pixels are created during light extraction.

The invention is not limited by the description of the exemplary embodiments. Rather, the invention includes any new feature and any combination of features, which in particular includes any combination of features in the patent claims, even if that feature or combination itself is not explicitly mentioned in the patent claims or exemplary embodiments.

The invention claimed is:

1. A display device having a plurality of pixels separately operable from each other, the display device comprising:
   a semiconductor layer sequence configured to generate electromagnetic radiation comprising a first semiconductor layer, an active layer and a second semiconductor layer;
   a first contact structure contacting the first semiconductor layer and a second contact structure contacting the second semiconductor layer; and
   at least one separating region extending through the first contact structure, the first semiconductor layer and the active layer into the second semiconductor layer,
   wherein the semiconductor layer sequence and the first contact structure have at least one first recess laterally adjacent with respect to a respective pixel, the at least one first recess extending through the first contact structure, the first semiconductor layer and the active layer into the second semiconductor layer,
   wherein the second contact structure comprises second contacts extending from a side of the semiconductor layer sequence facing the first contact structure through the at least one first recess,
   wherein the at least one separating region is arranged between two laterally adjacent pixels,
   wherein the at least one separating region does not extend completely though the semiconductor layer sequence,
   wherein the at least one separating region is configured to reduce optical and/or electrical crosstalk between the laterally adjacent pixels, and
   wherein the at least one separating region comprises a second recess at least partially filled with a material which is electrically insulating and light-absorbing, or
   wherein the at least one separating region comprises a second recess which at least partially filled with an electrically insulating material and which is at least partially filled with a light-absorbing material.

2. The display device according to claim 1, further comprising a light-absorbing material arranged between the at least one separating region and a carrier for the semiconductor layer sequence.

3. The display device according to claim 1, wherein the at least one separating region is arranged between two second contacts.

4. The display device according to claim 3, wherein the at least one separating region is arranged without interruption between the two second contacts.

5. The display device according to claim 3, wherein two or more separating regions are arranged between the two second contacts, the separating regions being spaced apart from one another.

6. The display device according to claim 1, wherein the at least one separating region extends further than the at least one first recess into the second semiconductor layer.

7. The display device according to claim 1, wherein the first contact structure has first contacts which are separately operable from one another and each of which extends laterally without interruption along the first semiconductor layer and each of which delimits a pixel laterally with its contour.

8. The display device according to claim 1, wherein a plurality of second contacts is assigned to at least one pixel, the second contacts redundantly contact the respective pixel.

9. The display device according to claim 1, wherein at least one of the second contacts is arranged laterally adjacent to a plurality of adjacent pixels and contacts the plurality of adjacent pixels.

10. The display device according to claim 1, wherein the pixels are arranged laterally separated in a grid-like manner, at least one of the second contacts being arranged on a node of the grid.

11. The display device according to claim 10, wherein one of the second contacts is arranged on each node of the grid.

12. The display device according to claim 10, wherein one of the second contacts is arranged on every second laterally successive node of the grid.

13. The display device according to claim 1, wherein at least one of the second contacts, which is assigned to a pixel which adjoins a lateral edge region of the display device, extends parallel along the edge region.

14. The display device according to claim 1, wherein at least one of the second contacts, which is assigned to a pixel which adjoins a lateral edge region of the display device, has a predetermined distance by which the respective second contact is arranged offset towards a lateral interior of the display device.

15. The display device according to claim 1, wherein a lateral extension of at least one of the second contacts is circular.

16. The display device according to claim 1, wherein at least one of the second contacts laterally encloses a pixel.

17. The display device according to claim 1, wherein the second contact structure is grid-shaped so that the second contacts are arranged at nodes of a grid.

18. A display device having a plurality of pixels operable separately from each other, the display device comprising:
   a semiconductor layer sequence for generating electromagnetic radiation comprising a first semiconductor layer, an active layer and a second semiconductor layer;
   a first contact structure contacting the first semiconductor layer and a second contact structure contacting the second semiconductor layer; and at least one separating region extending through the first contact structure, the first semiconductor layer and the active layer into the second semiconductor layer, wherein the semiconductor layer sequence and the first contact structure have at least one first recess laterally adjacent with respect to a respective pixel, the at least one first recess extending through the first contact structure, the first semiconductor layer and the active layer into the second semiconductor layer, wherein the second contact structure comprises second contacts extending from a side of the semiconductor layer sequence facing the first contact structure through the at least one first recess, wherein the at least one separating region is arranged between two laterally adjacent pixels, wherein the at least one separating region does not extend completely though the semiconductor layer sequence, wherein the at least one separating region is configured to reduce optical and/or electrical crosstalk between the laterally adjacent pixels, and wherein the at least one separating region extends further than the at least one first recess through which the second contacts extend into the second semiconductor layer.

19. The display device according to claim 18, wherein the at least one separating region comprises a second recess at least partially filled with an electrically insulating material and/or at least partially filled with a light-absorbing material.

* * * * *